US012740000B1

(12) United States Patent
Liu

(10) Patent No.: US 12,740,000 B1
(45) Date of Patent: Sep. 15, 2026

(54) AUTOMOTIVE EMERGENCY START POWER SUPPLY

(71) Applicant: Shenzhen Zhanpusida Technology Co., Ltd., Shenzhen (CN)

(72) Inventor: Yong Liu, Shenzhen (CN)

(73) Assignee: Shenzhen Zhanpusida Technology Co., Ltd., Shenzhen (CN)

( * ) Notice: Subject to any disclaimer, the term of this patent is extended or adjusted under 35 U.S.C. 154(b) by 0 days.

(21) Appl. No.: 19/632,156

(22) Filed: Mar. 27, 2026

(30) Foreign Application Priority Data

Nov. 17, 2025 (CN) ......................... 202522442039.5

(51) Int. Cl.
*H05K 7/14* (2006.01)
*B60R 16/03* (2006.01)

(52) U.S. Cl.
CPC ........... *H05K 7/1432* (2013.01); *B60R 16/03* (2013.01)

(58) Field of Classification Search
CPC ........ H05K 7/1432; B60R 16/03; H02J 7/342
See application file for complete search history.

(56) References Cited

U.S. PATENT DOCUMENTS 10,148,105 B2 * 12/2018 Lei .......................... F02N 11/10
10,250,056 B2 * 4/2019 Miller .................... G06F 1/263
D851,586 S * 6/2019 Liu .............................. D13/103
11,591,996 B2 * 2/2023 Koebler .............. F02N 11/0807
D1,008,163 S * 12/2023 Starkey ........................ D13/103
11,979,045 B2 * 5/2024 Lei ......................... H01R 11/24
12,095,107 B1 * 9/2024 Wu ..................... H01M 50/247
12,171,079 B1 * 12/2024 Liu ......................... B60R 16/03
2005/0110467 A1 * 5/2005 Thomason ............. H02J 1/122 320/165
2012/0068662 A1 * 3/2012 Durando ................. B60L 53/16 320/105
2012/0235629 A1 * 9/2012 Wood .................. H01R 11/288 320/107
2015/0091392 A1 * 4/2015 Hwang ................... H02J 7/751 307/150
2017/0012448 A1 * 1/2017 Miller ..................... H02J 7/342
2018/0342891 A1 * 11/2018 Nook .................. H01M 50/553
2020/0072177 A1 * 3/2020 Clarke .................... B60L 53/62
2021/0075235 A1 * 3/2021 Nook ........................ B60S 5/04
2021/0091578 A1 * 3/2021 Miller ....................... B60S 5/04
2023/0010475 A1 * 1/2023 Miller ..................... H02J 1/122
2023/0208135 A1 * 6/2023 Hacker Davidson ........................ F04D 25/0673 320/137

* cited by examiner

*Primary Examiner* — Abhishek M Rathod
(74) *Attorney, Agent, or Firm* — Westbridge IP LLC

(57) ABSTRACT

An automotive emergency start power supply relates to the field of automotive emergency start power supply technologies. The automotive emergency start power supply includes a housing, a power supply, a circuit board, a load, an electrical connector and a cover body. The power supply, the circuit board, the cover body, at least a first portion of the electrical connector, and at least a portion of the load are disposed in the housing. The cover body is configured to limit displacement of at least two of the circuit board, the load and the electrical connector.

19 Claims, 8 Drawing Sheets

AUTOMOTIVE EMERGENCY START POWER SUPPLY

CROSS-REFERENCE TO RELATED APPLICATIONS

This application claims priority to Chinese Patent Application No. 202522442039.5, filed on Nov. 17, 2025, the content of which is incorporated herein by reference in its entirety.

TECHNICAL FIELD

The present application relates to the field of automotive emergency start power supply technologies, and in particular, to an automotive emergency start power supply.

BACKGROUND

Currently, an automotive emergency start power supply is a multi-functional portable mobile power supply developed for car enthusiasts and professionals who travel by a car. Its standout feature is to start a car when a battery of the car is power-lack or the car cannot be started for other reasons. At the same time, it integrates functions such as an inflator pump, an automotive emergency start power supply and outdoor lighting, making it be one of essential products for outdoor travel. However, in the conventional technologies, a circuit board, a load, and an electrical connector inside a housing of the automotive emergency start power supply have problems of unstable installation and poor reliability, thereby resulting in a short service life of the automotive emergency start power supply.

SUMMARY

In view of this, an objective of the present application is to overcome shortcomings in the conventional technologies and provide an automotive emergency start power supply.

To solve the above technical problem, the present application provides an automotive emergency start power supply including a housing, a power supply, a circuit board, a load, an electrical connector and a cover body. The power supply, the circuit board, the cover body, at least a first portion of the electrical connector, and at least a portion of the load are disposed in the housing, and the cover body is configured to limit displacement of at least two of the circuit board, the load, and the electrical connector.

Additionally, the automotive emergency start power supply according to the present application may also have following additional technical features.

In some embodiments of the present application, the power supply is electrically connected to the circuit board and the electrical connector, respectively. The housing has a mounting portion, a first through hole and a second through hole. The first through hole is configured to allow an external device connected to the electrical connector to pass through, and the second through hole is configured to mount at least the portion of the load. The cover body has a first limiting portion and a second limiting portion, the mounting portion and the first limiting portion limit the displacement of the electrical connector, and the second limiting portion limits the displacement of the circuit board or the load.

In some embodiments of the present application, the first through hole and the second through hole are on a same side of the housing.

In some embodiments of the present application, the mounting portion has a first accommodating space, and at least the first portion of the electrical connector is received in the first accommodating space.

In some embodiments of the present application, the electrical connector has a first protrusion, the mounting portion has an engagement portion, and during installation, the first protrusion slides to a preset position through the engagement portion.

In some embodiments of the present application, a first groove is provided on a side of the cover body facing the electrical connector, and at least a portion of the mounting portion or at least a second portion of the electrical connector is received in the first groove.

In some embodiments of the present application, the mounting portion has an opening, and the opening is configured to install a cable connected to the electrical connector.

In some embodiments of the present application, the mounting portion includes a first side portion, a second side portion and a third side portion. The first side portion, the second side portion, and the third side portion form the first accommodating space, the second side portion has the opening, and edge portions of the first side portion, the second side portion, and the third side portion facing the cover body are received in the first groove.

In some embodiments of the present application, the electrical connector has a guide cylinder, and a cross-sectional area of the guide cylinder is larger than a cross-sectional area of the first through hole.

In some embodiments of the present application, the first through hole includes a first sub-first through hole and a second sub-first through hole, the guide cylinder includes a first sub-guide cylinder and a second sub-guide cylinder, a second accommodating space is provided between the first sub-guide cylinder and the second sub-guide cylinder, an axis of the first sub-guide cylinder passes through the first sub-first through hole, an axis of the second sub-guide cylinder passes through the second sub-first through hole, a second protrusion is provided on a side of the cover body facing the electrical connector, and at least a portion of the second protrusion is received in the second accommodating space.

In some embodiments of the present application, the cover body includes a first recessed portion and a second recessed portion, and the first recessed portion and the second recessed portion are located on two sides of the second protrusion. At least a portion of the first sub-guide cylinder is received in the first recessed portion, and at least a portion of the second sub-guide cylinder is received in the second recessed portion.

In some embodiments of the present application, the first limiting portion is connected to the mounting portion, and the second limiting portion is disposed on a side of the first limiting portion away from the electrical connector.

In some embodiments of the present application, the second limiting portion has a third accommodating space, and at least a portion of the load is received in the third accommodating space.

In some embodiments of the present application, a projection of the first limiting portion on a plane perpendicular to an axis of the first through hole is perpendicular or substantially perpendicular to a projection of the second limiting portion on the plane perpendicular to the axis of the first through hole.

In some embodiments of the present application, a hole area of the first through hole is less than a hole area of the second through hole.

In some embodiments of the present application, the first limiting portion and the mounting portion are positioned and connected to each other through a concave-convex structure.

In some embodiments of the present application, the housing includes a supporting member, the supporting member is disposed in the housing, and the supporting member has the mounting portion.

In some embodiments of the present application, an edge of the supporting member has a second groove facing the electrical connector, and a portion of the electrical connector is disposed in the second groove.

In some embodiments of the present application, a bottom of the second groove has a step; and the step is configured to prevent the electrical connector from being incorrectly mounted.

In some embodiments of the present application, the supporting member abuts against a side of the housing where the first through hole is located.

Compared with the conventional technologies, beneficial effects of the present application lie in the following.

The present application provides an automotive emergency start power supply. The automotive emergency start power supply includes a housing, a power supply, a circuit board, a load, an electrical connector, and a cover body. The power supply, the circuit board, the cover body, at least a portion of the electrical connector, and at least a portion of the load are disposed in the housing. By providing the cover body configured to limit the displacement of at least two of the circuit board, the load, and the electrical connector, the circuit board, the load, and the electrical connector are stably installed in the housing, thereby improving installation stability and reliability of the circuit board, the load, and the electrical connector, and thus' a service life of the automotive emergency start power supply is prolonged.

BRIEF DESCRIPTION OF THE DRAWINGS

In order to describe technical solutions in embodiments of the present application more clearly, the accompanying drawings required for describing the embodiments will be briefly introduced in the following. It should be understood that the following drawings show only certain embodiments of the present application, and therefore should not be considered as limiting the scope. For those with ordinary skill in the art, other related drawings may be obtained based on these drawings without creative effort.

DETAILED DESCRIPTION OF THE EMBODIMENTS

Figures 1, 2:
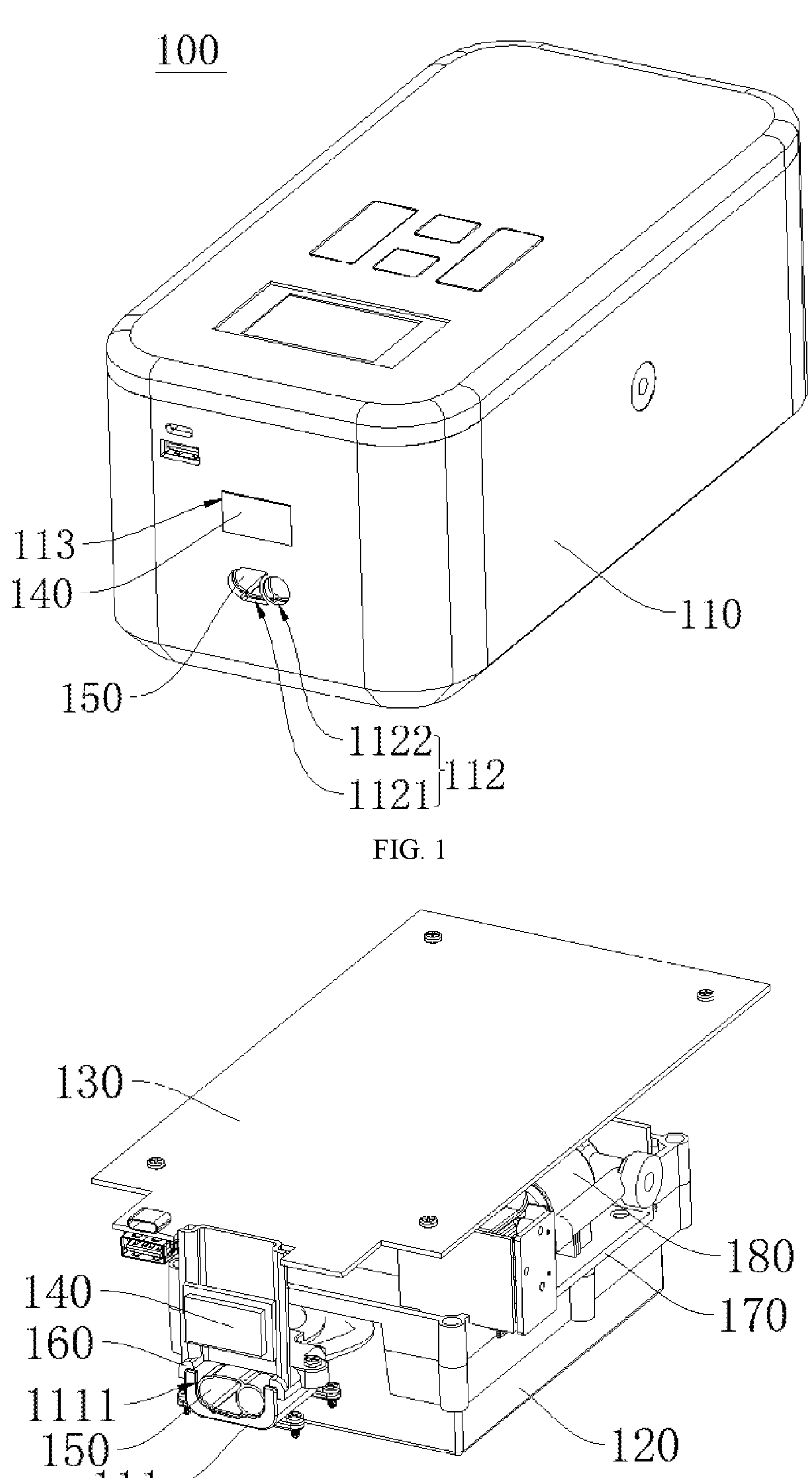
FIG. 1 shows a schematic three-dimensional view of an automotive emergency start power supply according to some embodiments of the present application.
FIG. 2 shows a schematic three-dimensional view of an automotive emergency start power supply with a housing omitted according to some embodiments of the present application.

Embodiments of the present application are described in detail below. Examples of the embodiments are illustrated in the accompanying drawings. The same or similar reference numerals throughout refer to the same or similar elements or elements having the same or similar functions. The embodiments described below with reference to the accompanying drawings are exemplary and are intended to explain the present application, and should not be construed as limiting the present application.

In the description of the present application, it should be understood that terms such as "center", "longitudinal", "lateral", "length", "width", "thickness", "upper", "lower", "front", "rear", "left", "right", "vertical", "horizontal", "top", "bottom", "inner", "outer", "clockwise", "counterclockwise", "axial", "radial", "circumferential", and so on, indicate orientations or positional relationships based on the orientations or positional relationships shown in the drawings. These terms are only for convenience of describing the present application and simplifying the description, and do not indicate or imply that the device or element referred to must have a specific orientation, be constructed, or operate in a specific orientation. Therefore, they should not be construed as limiting the present application.

Furthermore, the terms "first" and "second" are for descriptive purposes only, and should not be construed as indicating or implying relative importance or implicitly indicating the number of technical features referred to. Thus, features defined with the "first" and "second" may explicitly or implicitly include one or more of such features. In the description of the present application, "plurality" means two or more, unless otherwise explicitly and specifically defined.

In the present application, unless otherwise explicitly specified and defined, terms such as "mount", "connect", "couple", "fixe", and so on, should be understood broadly. For example, it may be a fixed connection, a detachable connection, or an integral connection; it may be a mechanical connection or an electrical connection; it may be a direct connection or an indirect connection through an intermediate medium; or it may be internal communication between two elements or an interaction relationship between two elements. For those with ordinary skill in the art, the specific meanings of the above terms in the present application may be understood based on specific situations.

In the present application, unless otherwise explicitly specified and defined, a first feature being "on" or "under" a second feature may mean that the first feature and the second feature are in direct contact, or that the first feature and second feature are in indirect contact through an intermediate medium. Moreover, a first feature being "above", "over", or "on top of" a second feature may mean that the first feature is directly above or obliquely above the second feature, or merely indicates that a horizontal height of the first feature is higher than that of the second feature. A first feature being "below", "under", or "underneath" a second feature may mean that the first feature is directly below or obliquely below the second feature, or merely indicates that a horizontal height of the first feature is lower than that of the second feature.

As shown in FIG. 1 and FIG. 2, an embodiment of the present application provides an automotive emergency start power supply 100 mainly for providing an emergency power supply 120 to start a car when a battery of the car is power-lack or the car cannot be started for other reasons. The automotive emergency start power supply 100 includes a housing 110, a power supply 120, a circuit board 130, a load 140, an electrical connector 150 and a cover body 160.

Among them, the power supply 120, the circuit board 130, the cover body 160, at least a first portion of the electrical connector 150, and at least a portion of the load 140 are disposed in the housing 110. The cover body 160 is configured to limit displacement of at least two of the circuit board 130, the load 140, and the electrical connector 150.

In the automotive emergency start power supply 100 provided by the embodiments of the present application, the power supply 120, the circuit board 130, the cover body 160, at least a first portion of the electrical connector 150, and at least a portion of the load 140 are disposed in the housing 110. By providing the cover body 160 configured to limit displacement of at least two of the circuit board 130, the load 140, and the electrical connector 150, the circuit board 130, the load 140, and the electrical connector 150 are stably installed in the housing 110, thereby improving installation stability and reliability of the circuit board 130, the load 140, and the electrical connector 150, and thus a service life of the automotive emergency start power supply 100 is prolonged.

Figure 3:
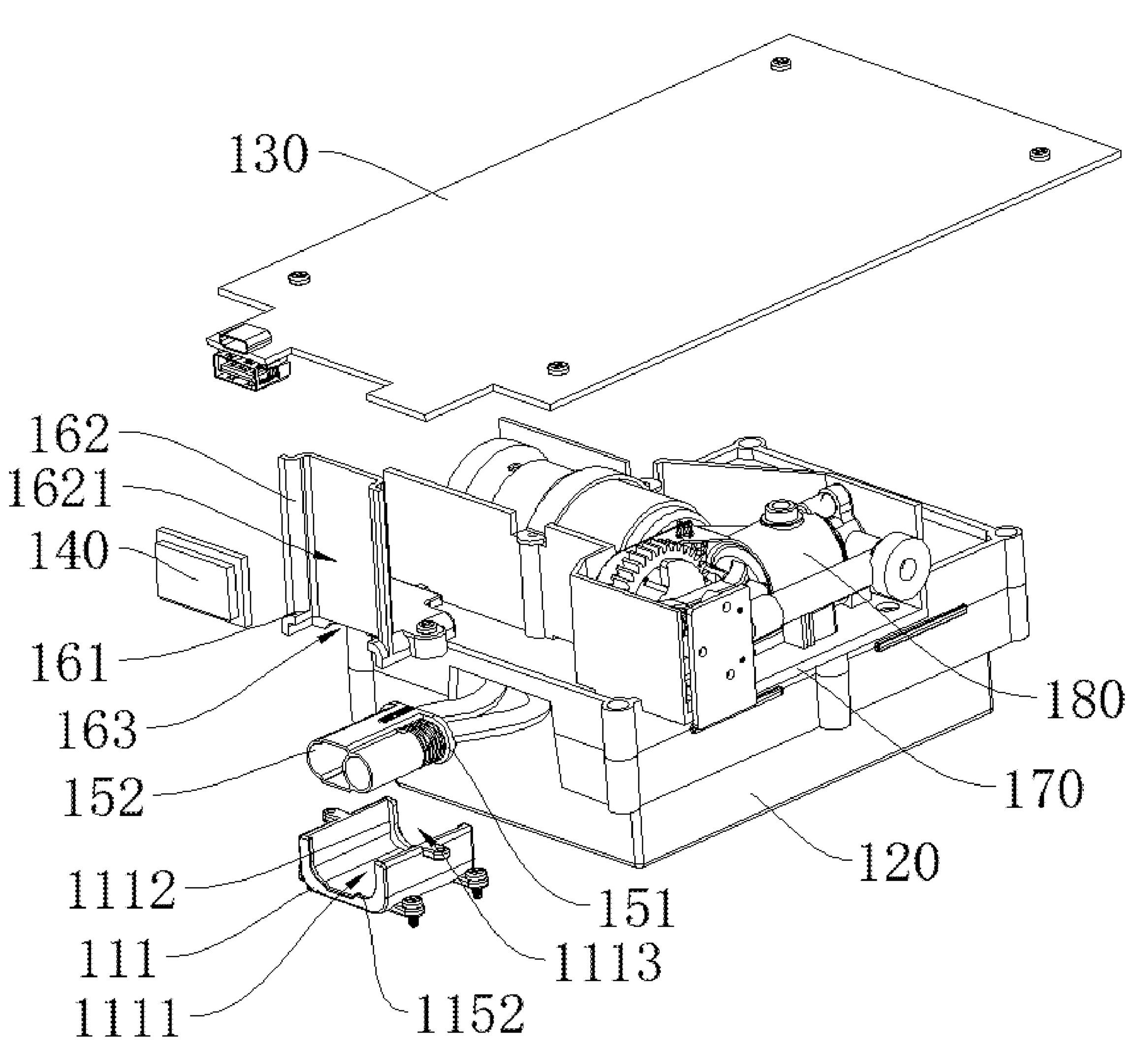
FIG. 3 shows a schematic exploded view of an automotive emergency start power supply with a housing omitted from one perspective according to some embodiments of the present application.
Figure 5:
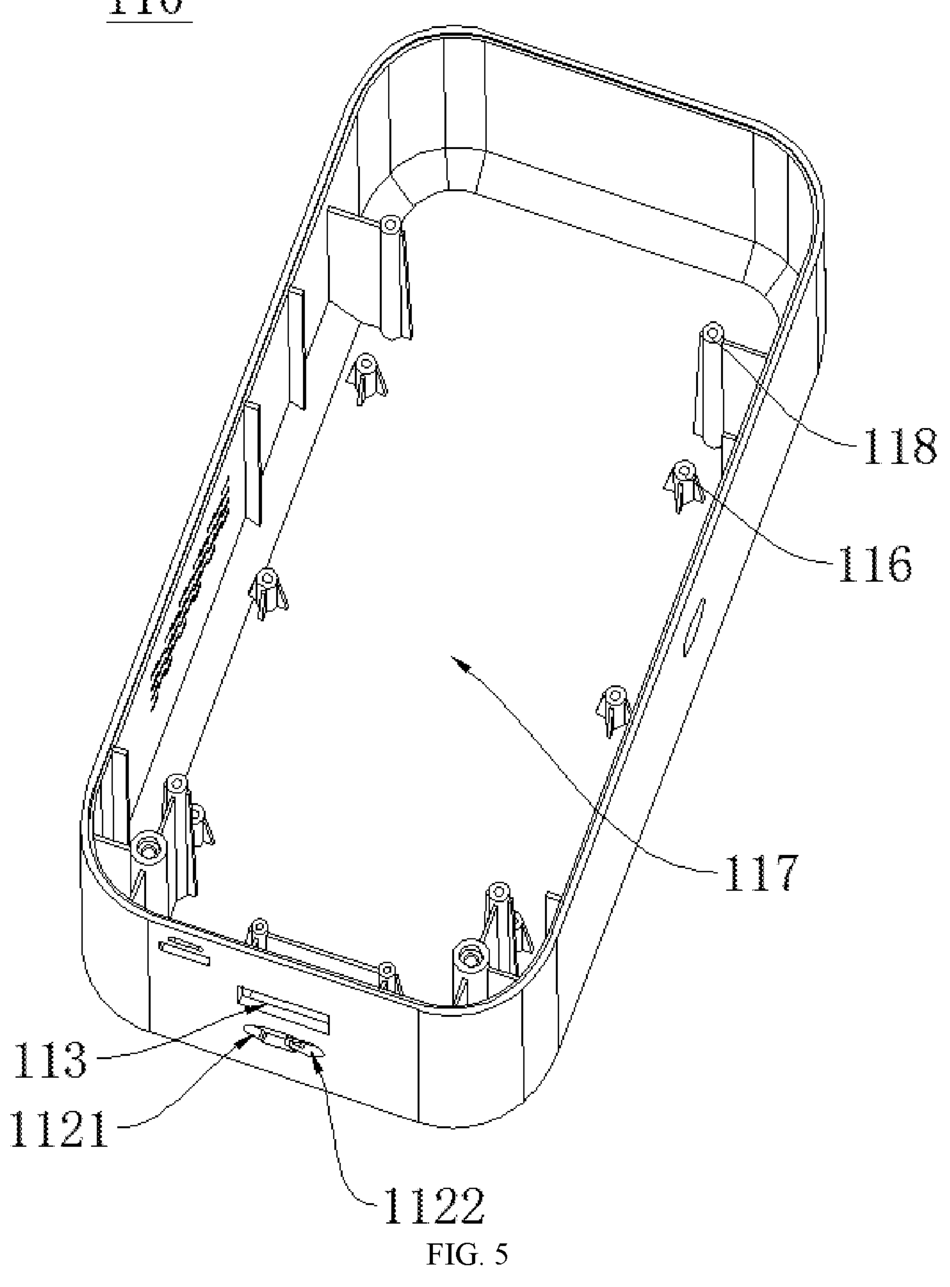
FIG. 5 shows a schematic three-dimensional view of a housing according to some embodiments of the present application.

As shown in FIG. 1, FIG. 3, and FIG. 5, in an embodiment of the present application, the power supply 120 is electrically connected to the circuit board 130 and the electrical connector 150, respectively. The housing 110 has a mounting portion 111, a first through hole 112, and a second through hole 113. The first through hole 112 is configured to allow an external device (for example, a portion of a body of the external device, or a connection line or plug of the external device) connected to the electrical connector 150 to pass through, so as to enable the external device to be connected to the electrical connector 150. The second through hole 113 is configured to mount at least the portion of the load 140. The cover body 160 has a first limiting portion 161 and a second limiting portion 162. The mounting portion 111 and the first limiting portion 161 limit the displacement of the electrical connector 150. The second limiting portion 162 limits the displacement of the circuit board 130 or the load 140.

In the embodiment of the present application, by electrically connecting the power supply 120 to the electrical connector 150, the electrical connector 150 is capable of outputting a current required to start an engine of a car, thereby realizing an emergency starting function of the automotive emergency start power supply 100. By electrically connecting the power supply 120 to the circuit board 130, the circuit board 130 is capable of outputting the current required by other electrical devices (such as a mobile phone, or the like). Exemplarily, the circuit board 130 is integrated with a voltage conversion module and a USB output interface. The power supply 120 is electrically connected to an input terminal of the voltage conversion module through a wire. The voltage conversion module is configured to convert and stabilize a voltage provided by the power supply 120 into a required current, for example, 5V DC, and output the current to the USB output interface. When an external electrical device (such as the mobile phone) is connected to the USB output interface, a working current is obtained.

The housing 110 has the first through hole 112 allowing an external device to pass through the first through hole 112 to electrically connect to the electrical connector 150, so that the electrical connector 150 outputs a current for starting the engine of the car. The housing 110 has the second through hole 113 for mounting at least a portion of the load 140, thereby achieving stable installation of the load 140. For example, the load 140 is a light-emitting assembly, the second through hole 113 allows light emitted from the load 140 to be projected outward, thereby providing illumination or indication functions for a user.

By providing the mounting portion 111 on the housing 110 and the first limiting portion 161 on the cover body 160, respectively, the displacement of the electrical connector 150 is limited under the cooperative action of the mounting portion 111 and the first limiting portion 161, thereby improving the installation stability and reliability of the electrical connector 150, and thus a service life of the product is prolonged. By providing the second limiting portion 162 on the cover body 160, the displacement of the circuit board 130 or the load 140 is limited by the second limiting portion 162, thereby improving the installation stability and reliability of the circuit board 130 or the load 140, and thus the service life of the product is further prolonged.

As shown in FIG. 1 and FIG. 5, in the above embodiment of the present application, the first through hole 112 and the second through hole 113 are on a same side of the housing 110. Consequently, the load 140 and the electrical connector 150 are located on the same side of the housing 110, so that the load 140 provides illumination or an indication function for the side of the housing 110 where the electrical connector 150 is located, thereby facilitating a user to accurately insert an external device into the electrical connector 150 in a dark environment.

As shown in FIG. 2 and FIG. 3, in the above embodiment of the present application, the mounting portion 111 has a first accommodating space 1111, and at least the first portion of the electrical connector 150 is received in the first accommodating space 1111.

In the present embodiment, by receiving at least the first portion of the electrical connector 150 in the first accommodating space 1111 of the mounting portion 111 of the housing 110, the electrical connector 150 is stably mounted in the first accommodating space 1111 of the mounting portion 111 of the housing 110, thereby improving the installation stability and reliability of the electrical connector 150, and thus the service life of the automotive emergency start power supply 100 is prolonged.

For example, the housing 110 and the mounting portion 111 may be integrally formed by injection molding or be connected after being separately formed.

Figure 4:
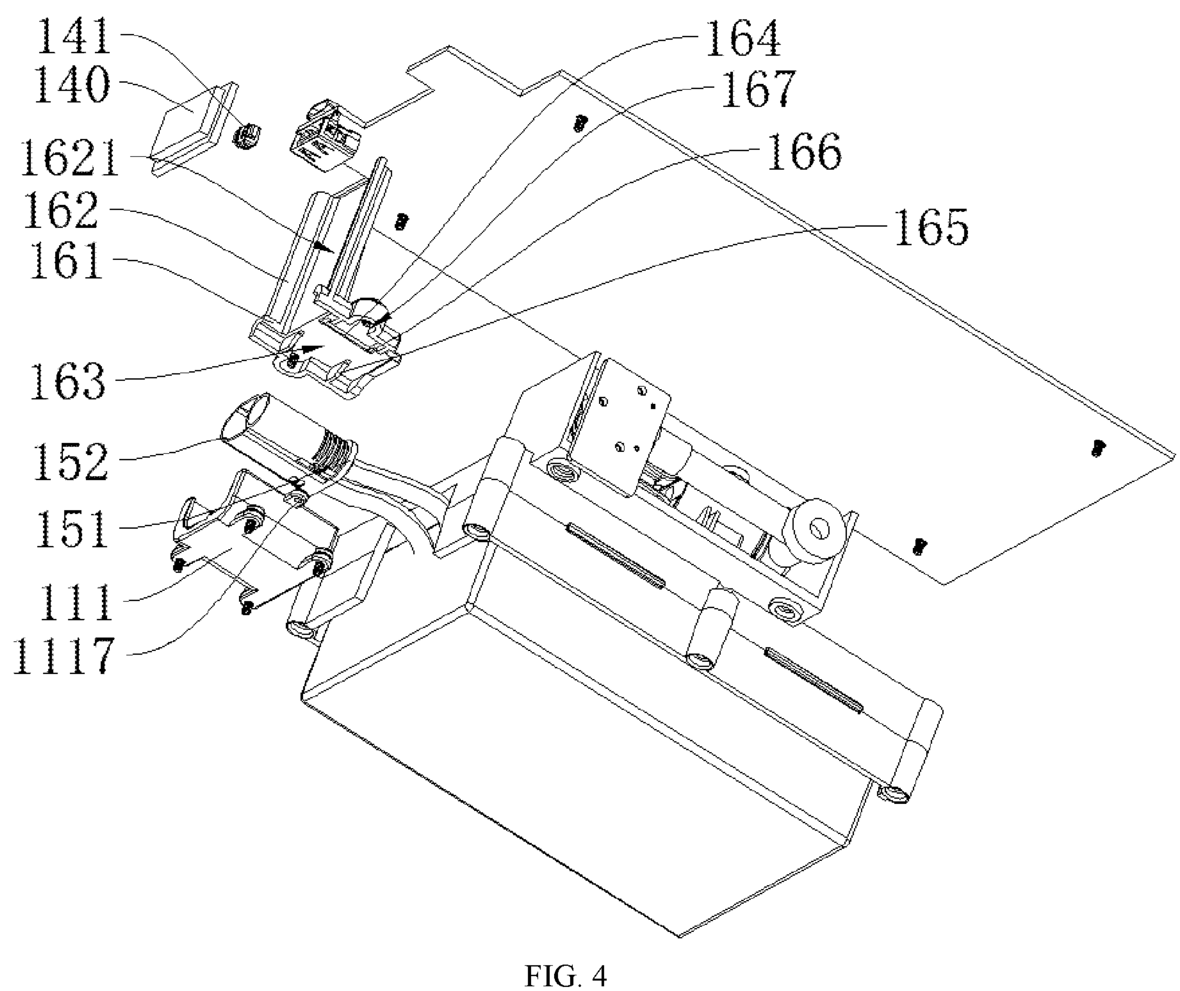
FIG. 4 shows a schematic exploded view of an automotive emergency start power supply with a housing omitted from another perspective according to some embodiments of the present application.

As shown in FIG. 3 and FIG. 4, in the above embodiment of the present application, the electrical connector 150 has a first protrusion 151, and the mounting portion 111 has an engagement portion 1112. During installation, the first protrusion 151 slides to a preset position through the engagement portion 1112, thereby effectively improving the assembly/disassembly efficiency, smoothness, and accuracy of the electrical connector 150.

As shown in FIG. 3 and FIG. 4, in the above embodiment of the present application, a first groove 163 is provided on a side of the cover body 160 facing the electrical connector 150. At least a portion of the mounting portion 111 or at least a second portion of the electrical connector 150 is received in the first groove 163. Consequently, under the action of the fixed connection between the cover body 160 and the mounting portion 111, the electrical connector 150 is limited in the first accommodating space 1111 of the mounting portion 111, thereby preventing the electrical connector 150 from moving or detaching from the first accommodating space 1111, so that the installation stability and reliability of the electrical connector 150 are improved, and thus the service life of the product is prolonged.

As shown in FIG. 3, in the above embodiment of the present application, the mounting portion 111 has an opening 1113. The opening 1113 is configured to install a cable connected to the electrical connector 150. Consequently, by providing the opening 1113 on the mounting portion 111, an avoidance function is achieved, thereby facilitating one end of the cable to be electrically connected to the power supply 120 and the other end of the cable to pass through the opening 1113 to connect to the electrical connector 150, and thus realizing the electrically connection between the electrical connector 150 and the power supply 120.

Figure 6:
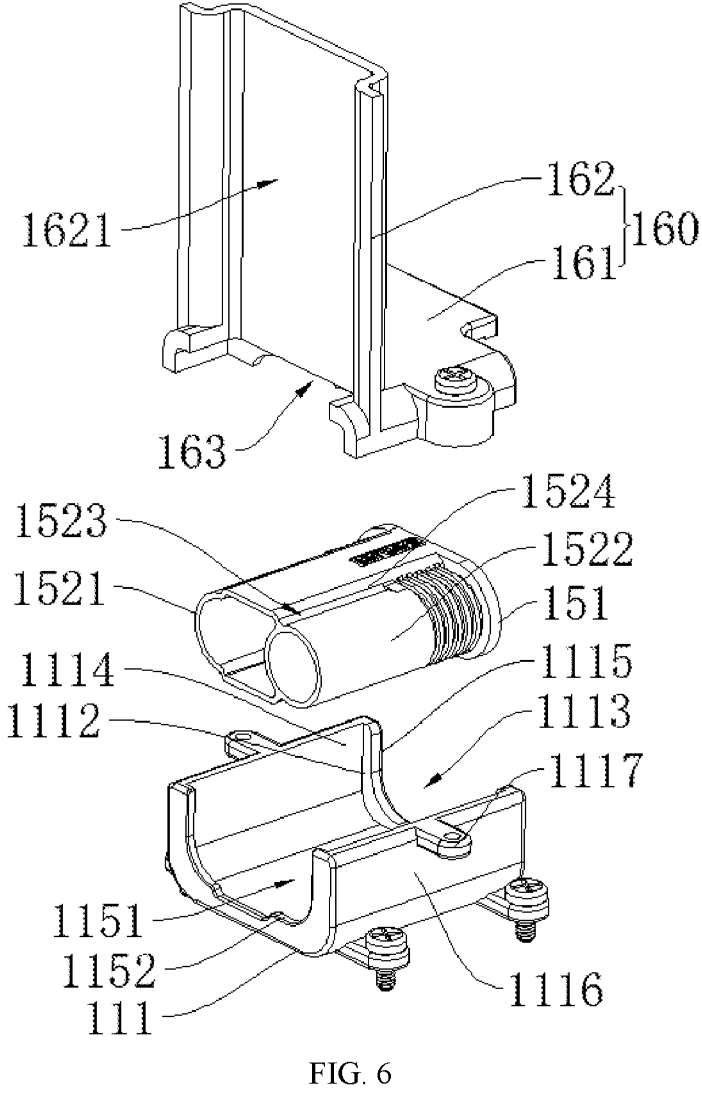
FIG. 6 shows a schematic exploded view of a supporting member, an electrical connector, and a cover body from one perspective according to some embodiments of the present application.

For example, as shown in FIG. 3 and FIG. 6, in the above embodiment of the present application, the mounting portion 111 includes a first side portion 1114, a second side portion 1115 and a third side portion 1116. The first side portion 1114, the second side portion 1115, and the third side portion 1116 form the first accommodating space 1111. The second side portion 1115 has the opening 1113, and edge portions of the first side portion 1114, the second side portion 1115, and the third side portion 1116 facing the cover body 160 are received in the first groove 163.

As shown in FIG. 1 and FIG. 3, in the above embodiment of the present application, the electrical connector 150 has a guide cylinder 152, and a cross-sectional area of the guide cylinder 152 is greater than a cross-sectional area of the first through hole 112.

In the embodiment of the present application, by setting the cross-sectional area of the guide cylinder 152 to be greater than the cross-sectional area of the first through hole 112, the housing 110 is capable of limiting the guide cylinder 152, thereby preventing the guide cylinder 152 from passing through the first through hole 112 and separating from the housing 110, which will affect the installation stability and reliability of the electrical connector 150.

Figure 7:
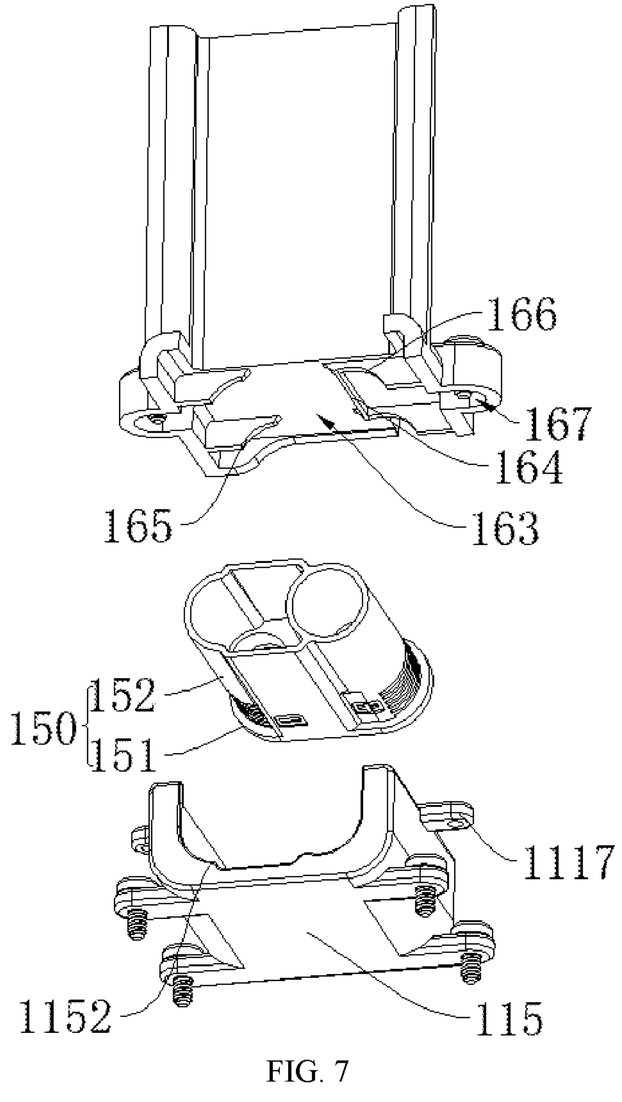
FIG. 7 shows a schematic exploded view of a supporting member, an electrical connector, and a cover body from another perspective according to some embodiments of the present application.

As shown in FIG. 5, FIG. 6, and FIG. 7, in the above embodiment of the present application, the first through hole 112 includes a first sub-first through hole 1121 and a second sub-first through hole 1122. The guide cylinder 152 includes a first sub-guide cylinder 1521 and a second sub-guide cylinder 1522, and a second accommodating space 1523 is provided between the first sub-guide cylinder 1521 and the second sub-guide cylinder 1522. An axis of the first sub-guide cylinder 1521 passes through the first sub-first through hole 1121. An axis of the second sub-guide cylinder 1522 passes through the second sub-first through hole 1122. A second protrusion 164 is provided on a side of the cover body 160 facing the electrical connector 150. And at least a portion of the second protrusion 164 is received in the second accommodating space 1523.

In the embodiment of the present application, the first sub-guide cylinder 1521 and the second sub-guide cylinder 1522 may be designed with different shapes. The first sub-first through hole 1121 and the second sub-first through hole 1122 are respectively adapted to the shapes of the first sub-guide cylinder 1521 and the second sub-guide cylinder 1522, so as to provide a foolproof function, preventing a user from reversely inserting the positive and negative poles of an external device into the corresponding positive and negative poles of the electrical connector 150 and cause a short circuit, thereby effectively improving safety and prolonging the service life of the automotive emergency start power supply 100.

The second accommodating space 1523 is provided between the first sub-guide cylinder 1521 and the second sub-guide cylinder 1522. By providing, on the side of the cover body 160 facing the electrical connector 150, the second protrusion 164 that is at least partially received in the second accommodating space 1523, the electrical connector 150 is limited in the first accommodating space 1111 of the mounting portion 111 by the second protrusion 164 of the cover body 160, thereby preventing the electrical connector 150 from moving or detaching from the first accommodating space 1111, so that the installation stability and reliability of the electrical connector 150 are improved, and thus the service life of the product is prolonged. For example, the second accommodating space 1523 is a recessed portion 1524 of the guide cylinder 152. One side of the recessed portion 1524 is the first sub-guide cylinder 1521, and the other side of the recessed portion 1524 is the second sub-guide cylinder 1522. The first sub-guide cylinder 1521, the recessed portion 1524, and the second sub-guide cylinder 1522 may be integrally formed by injection molding.

As shown in FIG. 6 and FIG. 7, in the above embodiment of the present application, the cover body 160 includes a first recessed portion 165 and a second recessed portion 166. The first recessed portion 165 and the second recessed portion 166 are located on two sides of the second protrusion 164. At least a portion of the first sub-guide cylinder 1521 is received in the first recessed portion 165. At least a portion of the second sub-guide cylinder 1522 is received in the second recessed portion 166. Consequently, the cover body 160 makes the first sub-guide cylinder 1521 be in close contact with the second sub-guide cylinder 1522 through the first recessed portion 165 and the second recessed portion 166 respectively, thereby ensuring the stability and reliability of the cover body 160 in restricting the movement of the electrical connector 150, so that the installation stability and reliability of the electrical connector 150 are further improved, and thus the service life of the product is further prolonged.

As shown in FIG. 3 and FIG. 6, in the above embodiment of the present application, the first limiting portion 161 is connected to the mounting portion 111. The second limiting portion 162 is disposed on a side of the first limiting portion 161 away from the electrical connector 150.

In the embodiment of the present application, the first limiting portion 161 is fixedly connected to the mounting portion 111 to limit the electrical connector 150 in the first accommodating space 1111 of the mounting portion 111, preventing the electrical connector 150 from moving or detaching from the first accommodating space 1111, thereby improving the installation stability and reliability of the electrical connector 150, and thus the service life of the product is prolonged. The second limiting portion 162 is disposed on the side of the first limiting portion 161 away from the electrical connector 150 to limit the movement of the load 140 and the circuit board 130, thereby enabling the load 140 and the circuit board 130 to be stably installed inside the housing 110.

As shown in FIG. 3, FIG. 4, and FIG. 6, in the above embodiment of the present application, the second limiting portion 162 has a third accommodating space 1621, and at least a portion of the load 140 is received in the third accommodating space 1621, so that the load 140 is stably installed between the side of the housing 110 with the second through hole 113 and the third accommodating space 1621, thereby improving the installation stability and reliability of the load 140. For example, the load 140 has a protruding portion 141 on a side facing the second limiting portion 162. At least a portion of the protruding portion 141 is received in the third accommodating space 1621. It may be understood that the load 140 is a light-emitting assembly, the light-emitting assembly is composed of a light-emitting element and a connector. The protruding portion 141 is the connector, that is, the connector is an electrical connection terminal is used for the light-emitting element to receive power from a power supply.

As shown in FIG. 1 and FIG. 6, in the above embodiment of the present application, a projection of the first limiting portion 161 on a plane perpendicular to an axis of the first through hole 112 is perpendicular or substantially perpendicular to a projection of the second limiting portion 162 on the plane perpendicular to the axis of the first through hole 112. Consequently, the first limiting portion 161 limits movement of the electrical connector 150 in a direction parallel to the plane perpendicular to the axis of the first through hole 112, and the second limiting portion 162 limits movement of the load 140 and the circuit board 130 in a direction parallel to the plane perpendicular to the axis of the first through hole 112.

As shown in FIG. 1 and FIG. 5, in the above embodiment of the present application, a hole area of the first through hole 112 is less than a hole area of the second through hole 113. It may be understood that the cross-sectional area of the guide cylinder 152 is less than the cross-sectional area of the load 140. By setting the hole area of the first through hole 112 to be less than the hole area of the second through hole 113, the shapes of the guide cylinder 152 and the load 140 are adapted.

As shown in FIG. 6 and FIG. 7, in the above embodiment of the present application, the first limiting portion 161 and the mounting portion 111 are positioned and connected to each other through a concave-convex structure, so that assembly personnel may quickly and accurately install the first limiting portion 161 of the cover body 160 onto the mounting portion 111. Moreover, the cooperation of the concave-convex structure may also limit movement of the first limiting portion 161 relative to the mounting portion 111, thereby further improving the stability and reliability of the cover body 160 in limiting the displacement of the electrical connector 150, and thus further improving the installation stability and reliability of the electrical connector 150. For example, the cover body 160 is provided with a third recessed portion 167, and the mounting portion 111 is provided with a third protrusion 1117 that cooperates with the third recessed portion 167.

For example, as shown in FIG. 6 and FIG. 7, in the above embodiment of the present application, the housing 110 includes a supporting member 115. The supporting member 115 is disposed in the housing 110, and the supporting member 115 has the mounting portion 111. For example, a connection method between the supporting member 115 and the housing 110 may be screw connection.

As shown in FIG. 1, FIG. 2, and FIG. 7, in the above embodiment of the present application, the supporting member 115 abuts against a side of the housing 110 where the first through hole 112 is located.

Consequently, under the abutting action of the side of the housing 110 having the first through hole 112 against the supporting member 115, the supporting member 115 is limited, thereby preventing the supporting member 115 from moving relative to the housing 110 toward the first through hole 112 along the axial direction of the first through hole 112, which will cause the electrical connector 150 to move synchronously relative to the housing 110 toward the first through hole 112, and thus further improving the installation stability and reliability of the electrical connector 150.

For example, as shown in FIG. 6 and FIG. 7, in the above embodiment of the present application, an edge of the supporting member 115 has a second groove 1151 facing the electrical connector 150. The second groove 1151 forms the first accommodating space 1111, and a portion of the electrical connector 150 is disposed in the second groove 1151, thereby achieving stable installation of the electrical connector 150.

As shown in FIG. 6 and FIG. 7, in the above embodiment of the present application, a bottom of the second groove 1151 has a step 1152. The step 1152, on one hand, is configured to prevent the electrical connector 150 from being incorrectly mounted, and on the other hand, may also limit the electrical connector 150, thereby preventing the electrical connector 150 from moving relative to the supporting member 115 toward the first through hole 112 along the axial direction of the first through hole 112, and thus further improving the installation stability and reliability of the electrical connector 150.

Figure 8:
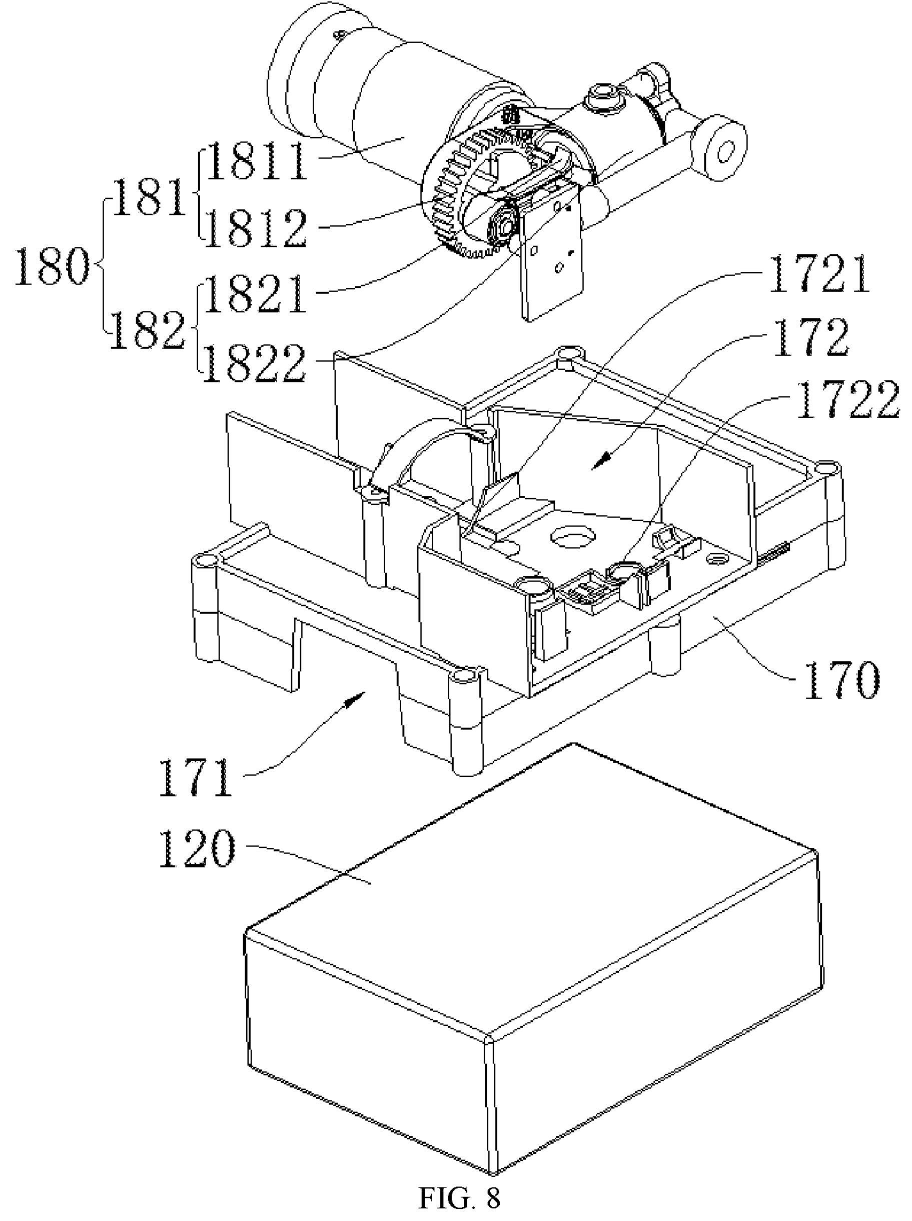
FIG. 8 shows a schematic exploded view of a bracket, a power supply, and an inflator pump from one perspective according to some embodiments of the present application.
Figure 9:
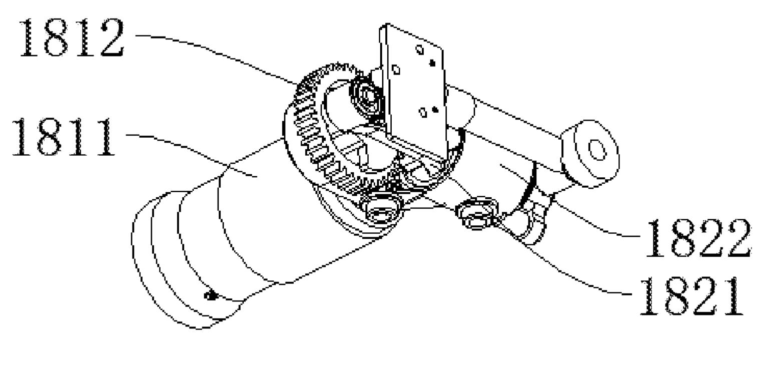
FIG. 9 shows a schematic exploded view of a bracket, a power supply, and an inflator pump from another perspective according to some embodiments of the present application.
Figure 9:
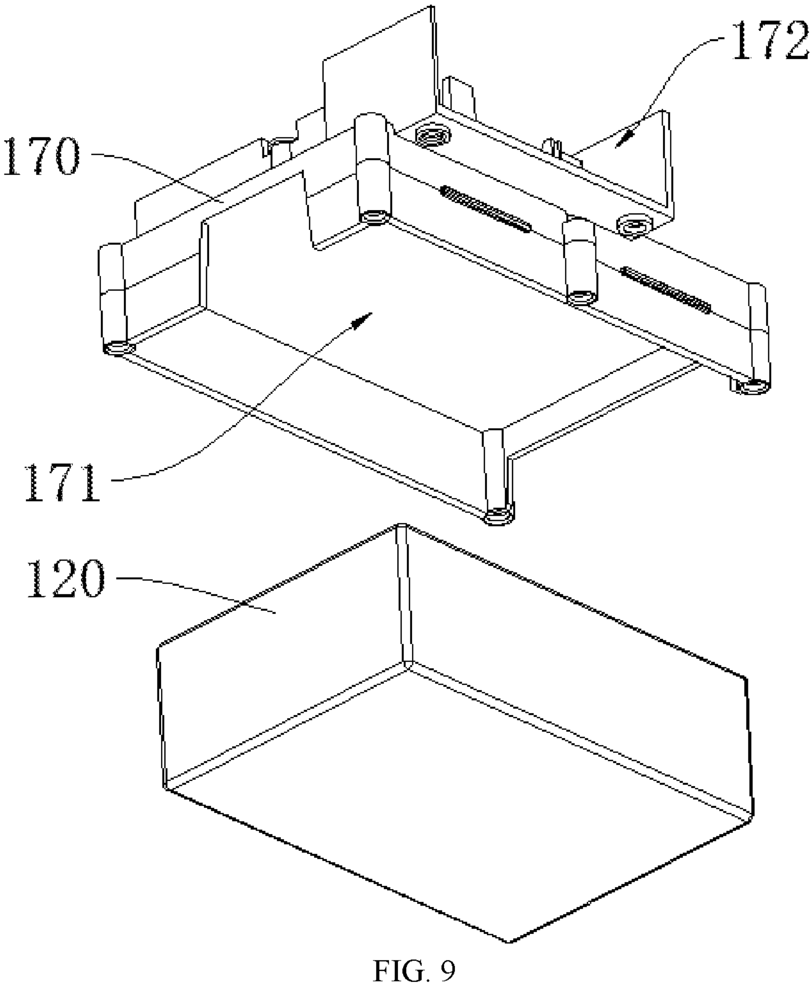

As shown in FIG. 2, FIG. 8, and FIG. 9, in the above embodiment of the present application, the automotive emergency start power supply 100 also includes a bracket 170 and an inflator pump 180. The power supply 120 is disposed on a side of the bracket 170. The inflator pump 180 is disposed on a side of the bracket 170 away from the power supply 120. Among them, the bracket 170 is provided with a first mounting groove 171 on a side facing the power supply 120, and the bracket 170 is provided with a second mounting groove 172 on a side away from the power supply 120. For example, the first mounting groove 171 is adapted to a shape of the power supply 120, and the second mounting groove 172 is adapted to a shape of the inflator pump 180. At least a portion of the power supply 120 is disposed in the first mounting groove 171. At least a portion of the inflator pump 180 is disposed in the second mounting groove 172. The inflator pump 180 is electrically connected to the circuit board 130.

In the embodiment of the present application, by providing the first mounting groove 171 and the second mounting groove 172 which are adapted to the shapes of the power supply 120 and the inflator pump 180 on two sides of the bracket 170 respectively, the power supply 120 and the inflator pump 180 are stably installed on the bracket 170, thereby preventing the power supply 120 and the inflator pump 180 from moving in the housing 110, and thus improving the installation stability and reliability of the power supply 120 and the inflator pump 180. The inflator pump 180 is electrically connected to the circuit board 130 to realize an inflation function of the automotive emergency start power supply 100, thereby enabling the automotive emergency start power supply 100 to inflate an external device to be inflated, such as car tires through its inflator pump 180, and thus enhancing the functional diversity of the automotive emergency start power supply 100.

As shown in FIG. 5, FIG. 8, and FIG. 9, in the above embodiment of the present application, the housing 110 is provided with a plurality of first mounting columns 116. The plurality of first mounting columns 116 are spaced apart to form a placement groove 117 adapted to the shape of the power supply 120. The bracket 170 is connected to the plurality of first mounting columns 116. The power supply 120 is located in the placement groove 117 and the first mounting groove 171. Consequently, stable installation of the power supply 120 is achieved. For example, the connection manner between the bracket 170 and the first mounting columns 116 may be screw connection.

As shown in FIG. 2 and FIG. 5, in the above embodiment of the present application, the housing 110 is provided with a plurality of second mounting columns 118. The plurality of second mounting columns 118 are spaced apart. The circuit board 130 is disposed on the plurality of second mounting columns 118 and is connected to the plurality of second mounting columns 118. Consequently, stable installation of the circuit board 130 is achieved. For example, the circuit board 130 is located on a side of the inflator pump 180 away from the bracket 170. The connection method between the circuit board 130 and the second mounting columns 118 may be screw connection.

As shown in FIG. 8 and FIG. 9, in the above embodiments of the present application, the inflator pump 180 includes a driving assembly 181 and a transmission assembly 182. The second mounting groove 172 is provided with a first bearing portion 1721 adapted to a shape of the driving assembly 181, and the second mounting groove 172 is provided with a second bearing portion 1722 adapted to a shape of the transmission assembly 182. Thereby, stable installation of the driving assembly 181 and the transmission assembly 182 is achieved. Exemplarily, the driving assembly 181 is composed of a drive motor 1811 and a reduction gear 1812, and the transmission assembly 182 is composed of a piston 1821 and a cylinder 1822. The connection and positional relationship therebetween refer to conventional arrangements in the art, and will not be repeated herein.

In the description of this specification, descriptions with reference to terms such as "one embodiment," "some embodiments," "example," "specific example," or "some examples" mean that specific features, structures, materials, or characteristics described in combination with the embodiment or example are included in at least one embodiment or example of the present application. In this specification, schematic representations of the above terms do not necessarily refer to the same embodiment or example. Moreover, the described specific features, structures, materials, or characteristics may be combined in any suitable manner in one or more embodiments or examples. Furthermore, without mutual contradiction, those skilled in the art may combine and integrate the different embodiments or examples described in this specification and the features of different embodiments or examples.

Although embodiments of the present application have been shown and described above, it should be understood that the above embodiments are exemplary and should not be construed as limiting the present application. Those of ordinary skill in the art may make variations, modifications, replacements, and modifications to the above embodiments within the scope of the present application.

What is claimed is:

1. An automotive emergency start power supply, comprising: a housing, a power supply, a circuit board, a load, an electrical connector and a cover body, wherein the power supply, the circuit board, the cover body, at least a first portion of the electrical connector, and at least a portion of the load are disposed in the housing, and the cover body is configured to limit displacement of at least two of the circuit board, the load, and the electrical connector;

wherein the power supply is electrically connected to the circuit board and the electrical connector respectively, the housing has a mounting portion, a first through hole and a second through hole, the first through hole is configured to allow an external device connected to the electrical connector to pass through, the second through hole is configured to mount at least the portion of the load, the cover body has a first limiting portion and a second limiting portion, the mounting portion and the first limiting portion limit the displacement of the electrical connector, and the second limiting portion limits the displacement of the circuit board or the load.

2. The automotive emergency start power supply according to claim 1, wherein the first through hole and the second through hole are on a same side of the housing.

3. The automotive emergency start power supply according to claim 1, wherein the mounting portion has a first accommodating space, and at least the first portion of the electrical connector is received in the first accommodating space.

4. The automotive emergency start power supply according to claim 3, wherein the electrical connector has a first protrusion, the mounting portion has an engagement portion, and during installation, the first protrusion slides to a preset position through the engagement portion.

5. The automotive emergency start power supply according to claim 4, wherein a first groove is provided on a side of the cover body facing the electrical connector, and at least a portion of the mounting portion or at least a second portion of the electrical connector is received in the first groove.

6. The automotive emergency start power supply according to claim 5, wherein the mounting portion has an opening, and the opening is configured to install a cable connected to the electrical connector.

7. The automotive emergency start power supply according to claim 6, wherein the mounting portion comprises a first side portion, a second side portion and a third side portion, the first side portion, the second side portion, and the third side portion form the first accommodating space, the second side portion has the opening, and edge portions of the first side portion, the second side portion, and the third side portion facing the cover body are received in the first groove.

8. The automotive emergency start power supply according to claim 1, wherein the electrical connector has a guide cylinder, and a cross-sectional area of the guide cylinder is larger than a cross-sectional area of the first through hole.

9. The automotive emergency start power supply according to claim 8, wherein the first through hole comprises a first sub-first through hole and a second sub-first through hole, the guide cylinder comprises a first sub-guide cylinder and a second sub-guide cylinder, a second accommodating space is provided between the first sub-guide cylinder and the second sub-guide cylinder, an axis of the first sub-guide cylinder passes through the first sub-first through hole, an axis of the second sub-guide cylinder passes through the second sub-first through hole, a second protrusion is provided on a side of the cover body facing the electrical connector, and at least a portion of the second protrusion is received in the second accommodating space.

10. The automotive emergency start power supply according to claim 9, wherein the cover body comprises a first recessed portion and a second recessed portion, the first recessed portion and the second recessed portion are located on two sides of the second protrusion, at least a portion of the first sub-guide cylinder is received in the first recessed portion, and at least a portion of the second sub-guide cylinder is received in the second recessed portion.

11. The automotive emergency start power supply according to claim 1, wherein the first limiting portion is connected to the mounting portion, and the second limiting portion is disposed on a side of the first limiting portion away from the electrical connector.

12. The automotive emergency start power supply according to claim 11, wherein the second limiting portion has a third accommodating space, and at least a portion of the load is received in the third accommodating space.

13. The automotive emergency start power supply according to claim 11, wherein a projection of the first limiting portion on a plane perpendicular to an axis of the first through hole is perpendicular or substantially perpendicular to a projection of the second limiting portion on the plane perpendicular to the axis of the first through hole.

14. The automotive emergency start power supply according to claim 1, wherein a hole area of the first through hole is less than a hole area of the second through hole.

15. The automotive emergency start power supply according to claim 1, wherein the first limiting portion and the mounting portion are positioned and connected to each other through a concave-convex structure.

16. The automotive emergency start power supply according to claim 3, wherein the housing comprises a supporting member, the supporting member is disposed in the housing, and the supporting member has the mounting portion.

17. The automotive emergency start power supply according to claim 16, wherein an edge of the supporting member has a second groove facing the electrical connector, and a portion of the electrical connector is disposed in the second groove.

18. The automotive emergency start power supply according to claim 17, wherein a bottom of the second groove has a step; and the step is configured to prevent the electrical connector from being incorrectly mounted.

19. The automotive emergency start power supply according to claim 16, wherein the supporting member abuts against a side of the housing where the first through hole is located.

* * * * *